US012775174B2

(12) United States Patent
Luo et al.

(10) Patent No.: US 12,775,174 B2
(45) Date of Patent: Oct. 27, 2026

(54) SYSTEMS, DEVICES, AND METHODS FOR LASER BEAM GENERATION

(71) Applicant: Pavilion Integration Corporation, San Jose, CA (US)

(72) Inventors: Ningyi Luo, San Jose, CA (US); Jihchuang Robin Huang, San Jose, CA (US)

(73) Assignee: PAVILION INTEGRATION CORPORATION, San Jose, CA (US)

( * ) Notice: Subject to any disclaimer, the term of this patent is extended or adjusted under 35 U.S.C. 154(b) by 679 days.

(21) Appl. No.: 18/022,717

(22) PCT Filed: Aug. 22, 2021

(86) PCT No.: PCT/US2021/047040

§ 371 (c)(1),
(2) Date: Feb. 22, 2023

(87) PCT Pub. No.: WO2022/046575

PCT Pub. Date: Mar. 3, 2022

(65) Prior Publication Data

US 2024/0036338 A1 Feb. 1, 2024

Related U.S. Application Data

(60) Provisional application No. 63/069,025, filed on Aug. 22, 2020.

(51) Int. Cl.

*G02B 27/09* (2006.01)
*G02B 3/00* (2006.01)
(Continued)

(52) U.S. Cl.

CPC ....... *G02B 27/0927* (2013.01); *G02B 3/0062* (2013.01); *G02B 27/0961* (2013.01);
(Continued)

(58) Field of Classification Search

CPC G02B 27/09; G02B 27/0927; G02B 27/0961; G02B 27/0966; G02B 27/0955;
(Continued)

(56) References Cited

U.S. PATENT DOCUMENTS 4,733,944 A * 3/1988 Fahlen ................ B23K 26/073 359/624
6,384,981 B1 5/2002 Hauschild
(Continued)

FOREIGN PATENT DOCUMENTS

WO WO2020069885 A1 4/2020

OTHER PUBLICATIONS

International Search Report and Written Opinion of the International Searching Authority. International Application No. PCT/US21/47040 issued by the USPTO ISA/US, mail date Jan. 11, 2022, 15 pages, USPTO, Alexandria, VA.
(Continued)

*Primary Examiner* — Jie Lei
(74) *Attorney, Agent, or Firm* — Peter B Scull

(57) ABSTRACT

Devices, systems, and methods for generating high power flattop laser beams are disclosed. Schematics and arrangements of diodes, fast axis and slow axis cylindrical lens arrays, collimation lenses, and other optics are described and disclosed. Also disclosed are methods of generating flattop beams for myriad applications.

19 Claims, 9 Drawing Sheets

(51) Int. Cl.
*G02B 27/30* (2006.01)
*H01S 5/00* (2006.01)
*H01S 5/40* (2006.01)
*G02B 27/28* (2006.01)

(52) U.S. Cl.
CPC ......... *G02B 27/0966* (2013.01); *G02B 27/30* (2013.01); *H01S 5/005* (2013.01); *H01S 5/4025* (2013.01); *G02B 27/283* (2013.01)

(58) Field of Classification Search
CPC .... G02B 27/14; G02B 27/141; G02B 27/144; G02B 27/30; G02B 27/28; G02B 27/283; G02B 3/00; G02B 3/005; G02B 3/0062; G02B 19/0014; G02B 19/0057; H01S 5/00; H01S 5/005; H01S 5/40; H01S 5/4031; H01S 5/4025; H01S 5/4012; H01S 5/0057; B23K 26/06; B23K 26/064; B23K 26/073; B23K 26/0732
USPC ....... 359/623, 624, 618, 619, 641, 642, 646, 359/710, 741, 800; 362/257, 259, 297, 362/299
See application file for complete search history.

(56) References Cited

U.S. PATENT DOCUMENTS

| | | | | |
|---|---|---|---|---|
| 2002/0024740 | A1* | 2/2002 | Hashimoto ........ | G02B 19/0014 359/623 |
| 2011/0279903 | A1* | 11/2011 | Wiedemann ......... | G02B 27/143 359/618 |
| 2013/0112667 | A1 | 5/2013 | Holmgren et al. | |
| 2015/0003484 | A1 | 1/2015 | Muendel | |
| 2016/0301899 | A1* | 10/2016 | Miura .................. | G03B 21/005 |

OTHER PUBLICATIONS

Transmittal of International Preliminary Report on Patentability for Application No. PCT/US2021/047040 issued by the International Bureau of WIPO, Geneva, Switzerland date of mailing Mar. 9, 2023, 1 page, which includes the International Preliminary Report on Patenability date of issuance Feb. 28, 2023, 1 page, with the Written Opinion of the International Searching Authority. International Application No. PCT/US21/47040 issued by the USPTO ISA/US, mail date Jan. 11, 2022, 7 pages, USPTO, Alexandria, VA.

* cited by examiner

SYSTEMS, DEVICES, AND METHODS FOR LASER BEAM GENERATION

BACKGROUND

Advances in software, electronics, and materials science have led to numerous advanced scientific instruments that utilize and implement lasers to perform a variety of crucial operations. In particular, many of these advanced scientific instruments may employ lasers for high throughput.

A laser is an apparatus that emits light via a process of optical amplification based on the stimulated emission of electromagnetic radiation. A laser emits coherent light—that is—the frequency and waveform of laser light are identical. The spatial coherence of a laser beam may allow a laser beam to stay narrow over a distance and spread minimally as it propagates, and thus may be useful as a collimated beam. Many lasers produce a Gaussian beam and/or Gaussian shaped profile that may be approximated by a Gaussian function; however, some applications may benefit from having a flattop shaped profile.

SUMMARY

The present developments disclose and describe systems, devices, and methods, for generating a light beam that has a flat intensity profile, or flattop beam. In one aspect, a pair of cylindrical lens arrays may be used to homogenize a beam profile in the slow axis (X) of the diode lasers. In another aspect, a laser beam may be collimated in the fast axis (Y) by using a fast axis collimation lens.

In one aspect, in order to increase the power density, several collimated laser beams are stacked in the y-direction in close proximity. In some implementations, the laser diodes may be tilted relative to each other to shift the intensity peaks of each beam and thus the combined beam may have an improved uniformity of intensity of the flattop profile.

In one aspect, two similar laser diode beams may be polarization combined by using a polarization combining cube to double the total power.

In another aspect of the current developments, two high power uniform lines of different wavelengths at some spacing can be formed using dichroic mirrors.

BRIEF DESCRIPTION OF DRAWINGS

For a detailed description of exemplary implementations of the developments, reference will now be made to the accompanying drawings in which.

DETAILED DESCRIPTION

Figure 1A:
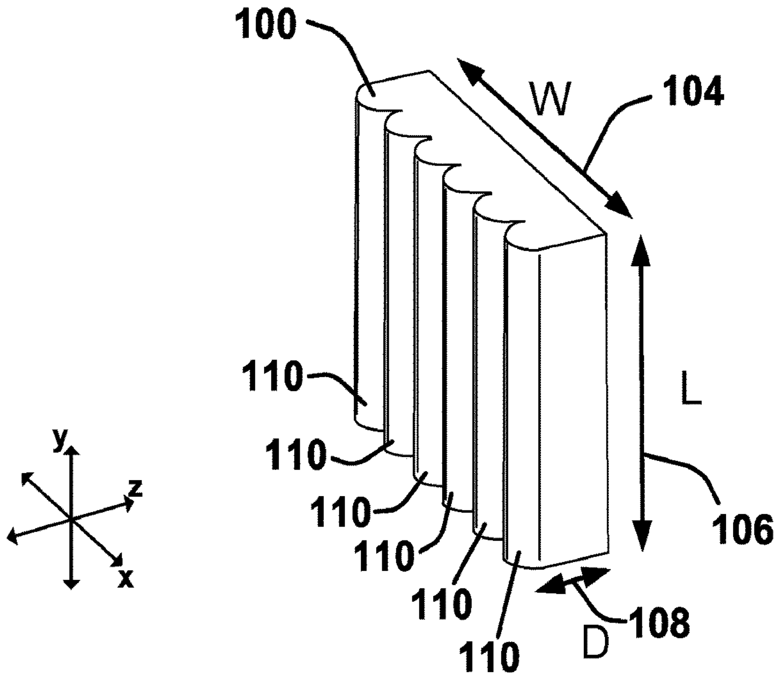
FIG. 1A provides an isometric view of a cylindrical lens array.

While the developments hereof are amenable to various modifications and alternative forms, specifics hereof have been shown herein by way of non-limitative examples in the drawings and the following description. It should be understood, however, that this is not to limit the inventions hereof to the particular embodiments described. This is instead to cover all modifications, equivalents, and alternatives falling within the spirit and scope of the developments whether described here or otherwise being sufficiently appreciable as included herewithin even if beyond the literal words or figures hereof.

The following discussion is directed to various implementations of the developments hereof. Although one or more of these implementations may be preferred, the implementations disclosed should not be interpreted, or otherwise used, as or for limiting the scope of the disclosure, including the claims. In addition, one skilled in the art will understand that the following description has broad applications, and the discussion of any implementation is only exemplary of that implementation and is not to intimate that the scope of the disclosure, including the claims, is limited to that implementation.

Figure 1B:
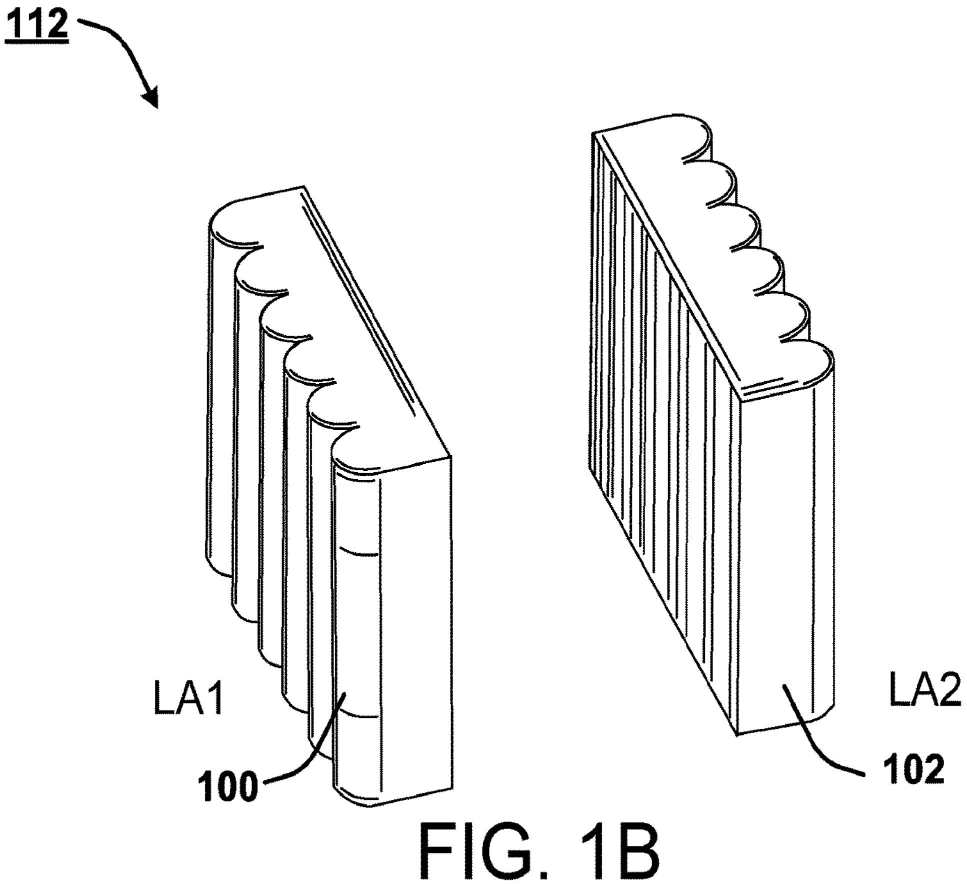
FIG. 1B provides an isometric view of two cylindrical lens arrays.

In general, included here are devices, systems and methods for generating laser beams. More specifically, devices, systems, and methods for generating high power flat-top laser beams are disclosed and described. A cylindrical lens array 100, as shown in the isometric view of FIG. 1A, may be used in devices, systems, and methods, herein described and disclosed. The cylindrical lens array 100 may have a width (W) 104, length (L) 106, and depth (D) 108. The cylindrical lens array 100 may be a unitary structure with two or more half cylinder shaped convex lenses, or lenslets 110, that run the entire length of one side of the structure. A pair of cylindrical lens arrays 112, comprising a first cylindrical lens array (LA1) 100 and a second cylindrical lens array (LA2) 102, is shown in FIG. 1B. In one aspect of the developments hereof, one pair of cylindrical lens arrays 112 is utilized to homogenize the beam profile in the slow axis (X) of the light source, which in some instances may be a diode laser 114, as in FIG. 2.

Figure 2:
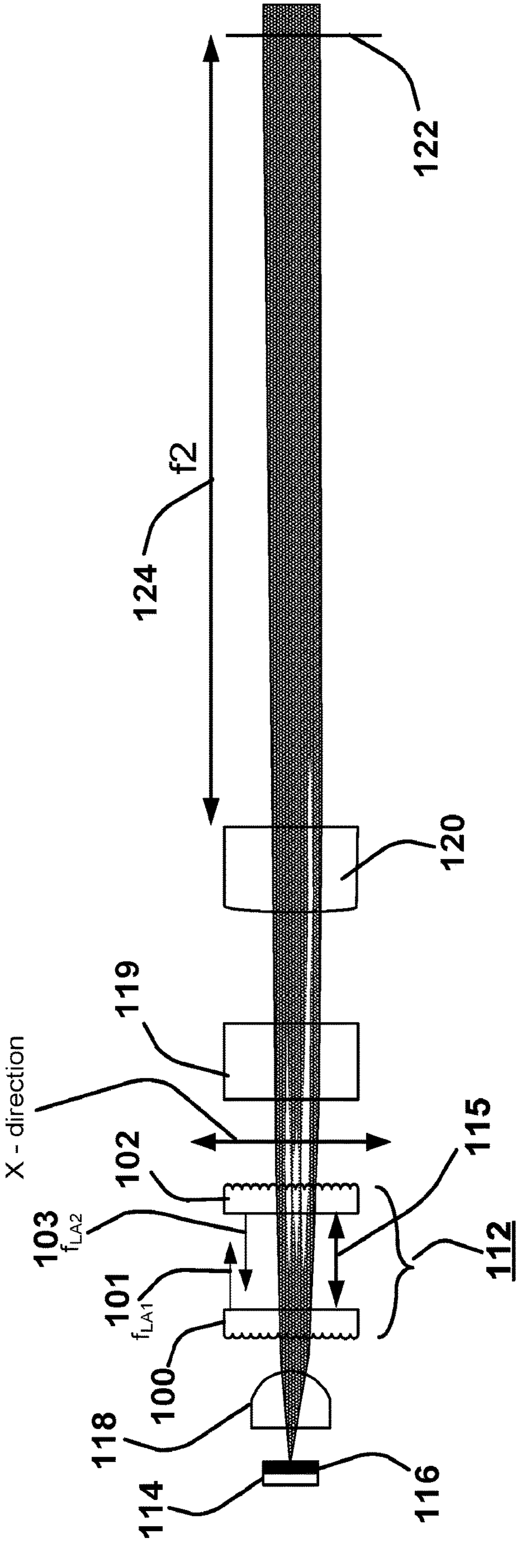
FIG. 2 provides a plan view of one exemplar hereof.
Figure 3:
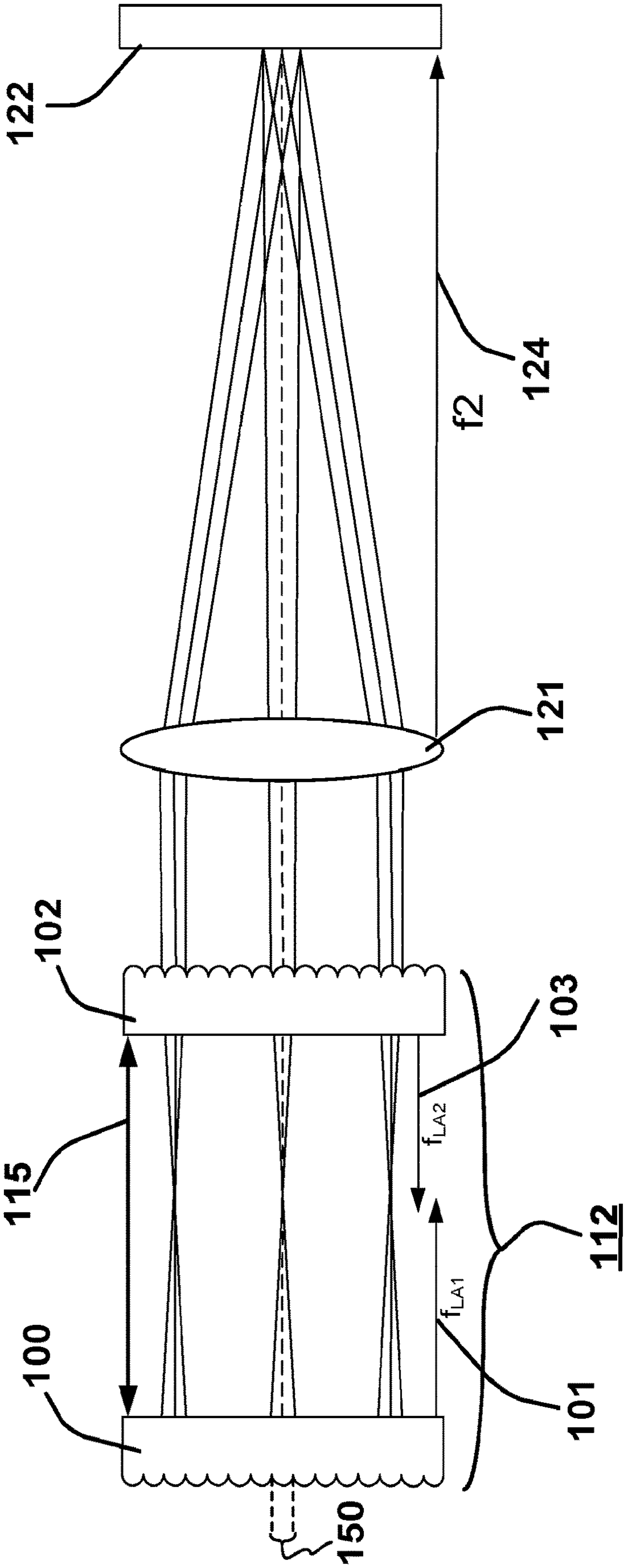
FIG. 3 provides a schematic diagram of one implementation disclosed and described.

A diode laser's slow and fast axes are arranged in X and Y axes, respectively; that is, the X-axis is the slow axis, and the Y-axis is the fast axis. As depicted in FIGS. 2 and 3, the lens array LA1 100 has an effective focal length ($f_{LA1}$) 101. The lens array LA2 102 has effective focal length($f_{LA2}$) 103. In most implementations, the distance 115 between lens arrays LA1 100 and LA2 102 is greater than $f_{LA2}$ 103 but less than $f_{LA1}$ 101+$f_{LA2}$ 103. The physical characteristics and features of the lens arrays including the focal lengths and pitch may allow the light source to be manipulated and controlled to produce a beam or line a disclosed and described in more detail below.

In FIG. 2, a light source 114, in this implementation a diode laser is directed at a fast axis collimation lens (FAC) 116 and then at a slow axis collimation (SAC) lens 118. The beam is then directed at LA1 100 to fill up several of the lenslets 110. In a preferred implementation, the beam may fill five or more of the lenslets 110 of LA1 100. Next, LA2 102 and one or more focusing lenses (CL1, CL2) 119, 120 are used together to image the beamlets of LA1 and to overlap them in the image plane 122, where CL1 controls the fast-axis focusing and CL2 controls the slow-axis imaging. If CL1 and CL2 have the same focal length, one spherical Fournier lens 121 may be substituted for CL1 119 and CL2 120 as shown and depicted in FIG. 3. The image plane 122 is located at the focal length (f2) 124 of the focusing lens, CL2 120. In this way, a uniform profile in X-direction is produced by mixing many beamlets which may contain different powers. The X-axis has an image width between at least about 100 μm and about a few centimeters. FIG. 3 also identifies the pitch of the lens array ($P_{LA}$) 150, that is the vertex clearance between two neighboring lenses of the array.

Figure 4:
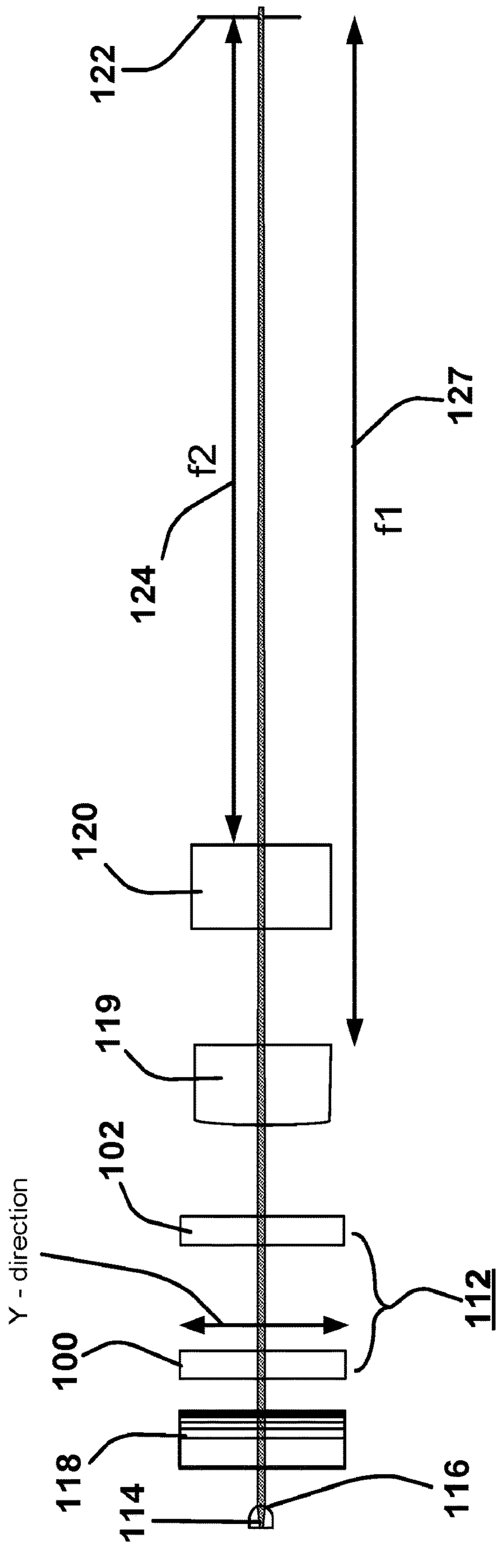
FIG. 4 provides a side view of an exemplar hereof.

In the fast axis Y, the light source or laser beam is collimated by using a fast axis collimation lens (FAC) 116. The beam is then focused to the desired width at the image plane 122 by choosing a proper combination of focal lengths for FAC 116 and CL1 119, as shown in FIG. 4. The distance between CL1 119 and the image plane 122, is the focal length, f1 127 of the focusing lens CL1 119.

Figure 5:
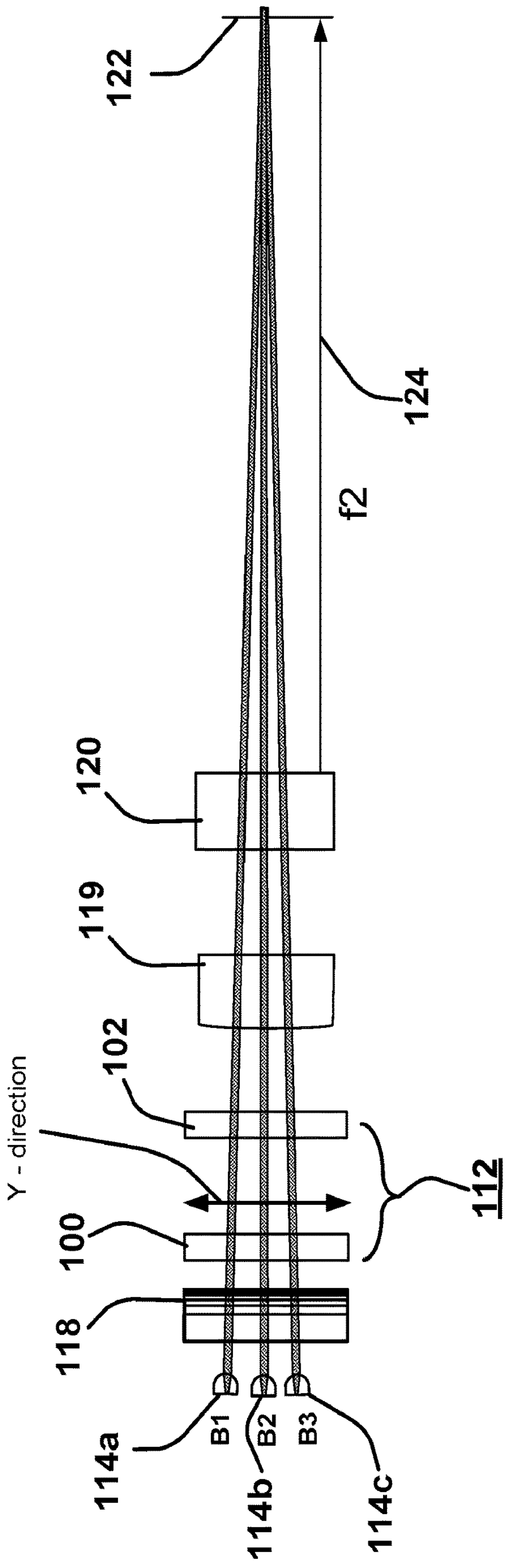
FIG. 5 provides a side view of an implementation that includes three diode lasers.
Figure 6:
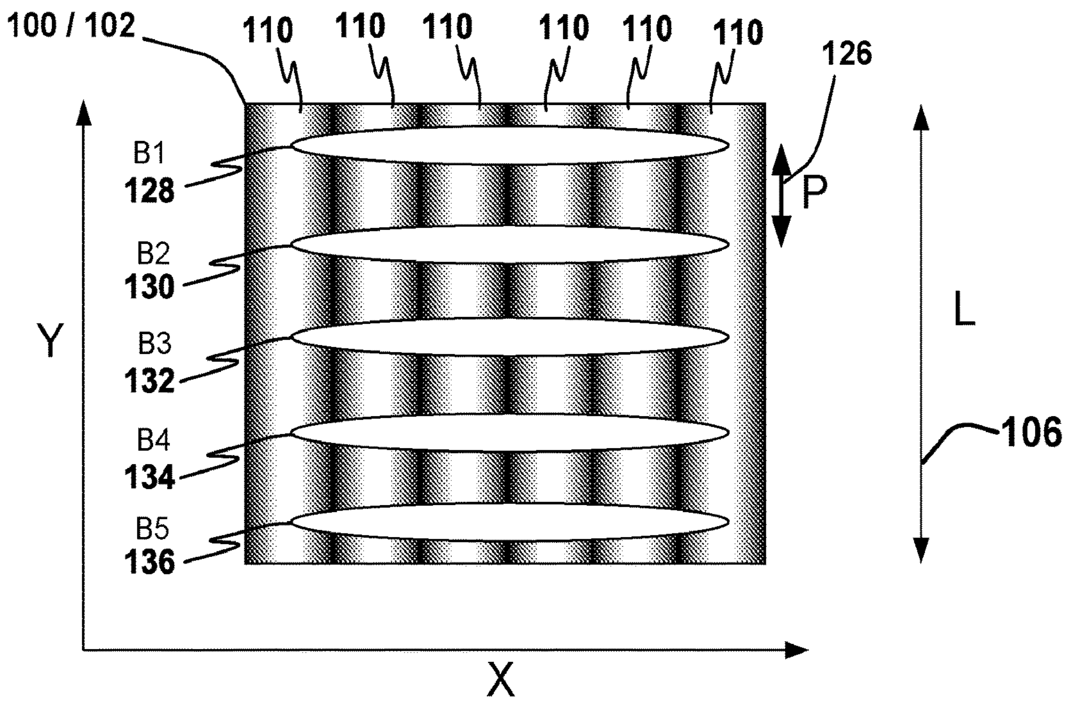
FIG. 6 provides a front view a several beams arranged vertically propagated towards a lens array.

In order to increase the power density, many collimated laser beams may be stacked in the Y direction in close distance or proximity to each other. The positions are offset in Y direction to avoid mechanical interference. For example, three diode lasers (B1, B2, B3) 114*a*, 114*b*, 114*c* are arranged in a stack as shown in FIG. 5. It may be that the laser diodes 114*a*, 114*b*, 114*c* are packed as closely as possible to utilize the whole length 106 of the cylindrical lens array 100, as shown in FIG. 6. The maximum number of diode lasers that may be compatible with the length 106 dimension of a cylindrical lens array 100/102 is approximated to be L/p+1, where p 126 is the center to center measurement of the beam 128 and beam 130. Beams 132, 134,136 are also separated by the same distance p 126 as further shown in FIG. 6.

A multimode diode laser has partial coherence. This produces periodic peaks of spacing $\Lambda_{FP}$ as defined by the equation:

$$\Lambda_{FP} = \frac{\lambda \cdot f_{FL}}{P_{LA}}$$

where λ is the laser wavelength, $f_{FL}$=f2 that is the focal length of the focusing lens CL2 120, as shown in FIG. 2 and FIG. 3, and $P_{LA}$=pitch of lens array. A lens array is characterized by the pitch, $P_{LA}$ 150, i.e. the vertex clearance between two neighboring lenses of the array.

Figure 8:
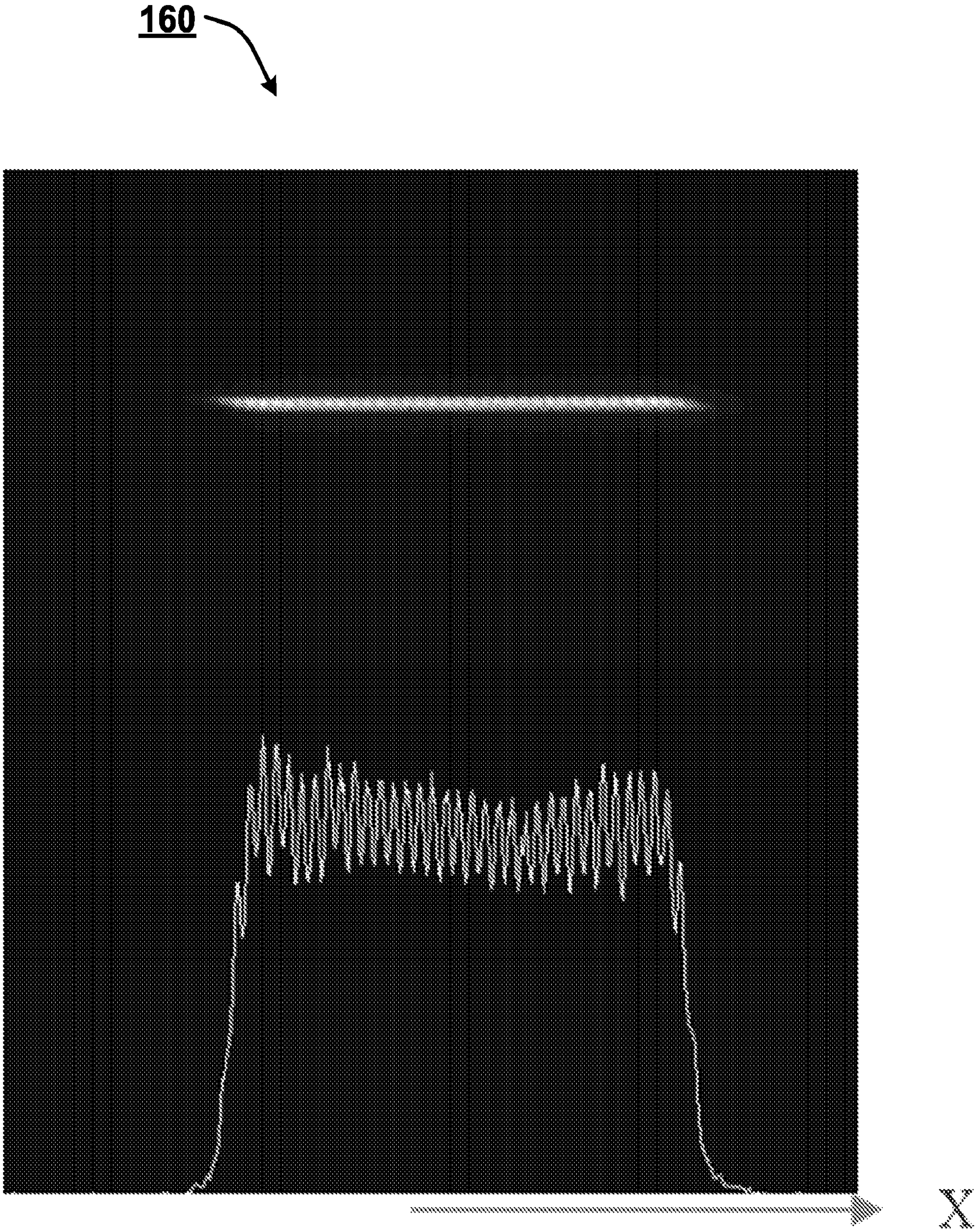
FIG. 8 illustrates an example of a line image produced by a single diode laser.

A line image 160 having a period pattern as shown in FIG. 8, may be produced by a single diode laser that has intensity variation according to the following formula:

$$\frac{I_{Max} - I_{Min}}{I_{Max} + I_{Min}}$$

In order to reduce the intensity variation, several to many diode lasers may be overlapped with an appropriate arrangement to shift the peaks of one diode laser to another diode laser. When all of the diode lasers are parallel to each other, such as in FIG. 6, the periodic patterns match to each other which produces no improvement to the uniformity. To improve the uniformity, the diode lasers are tilted relative to each other to shift the peaks of the intensity and achieve a smooth and improved uniformity of the intensity profile.

Figure 7:
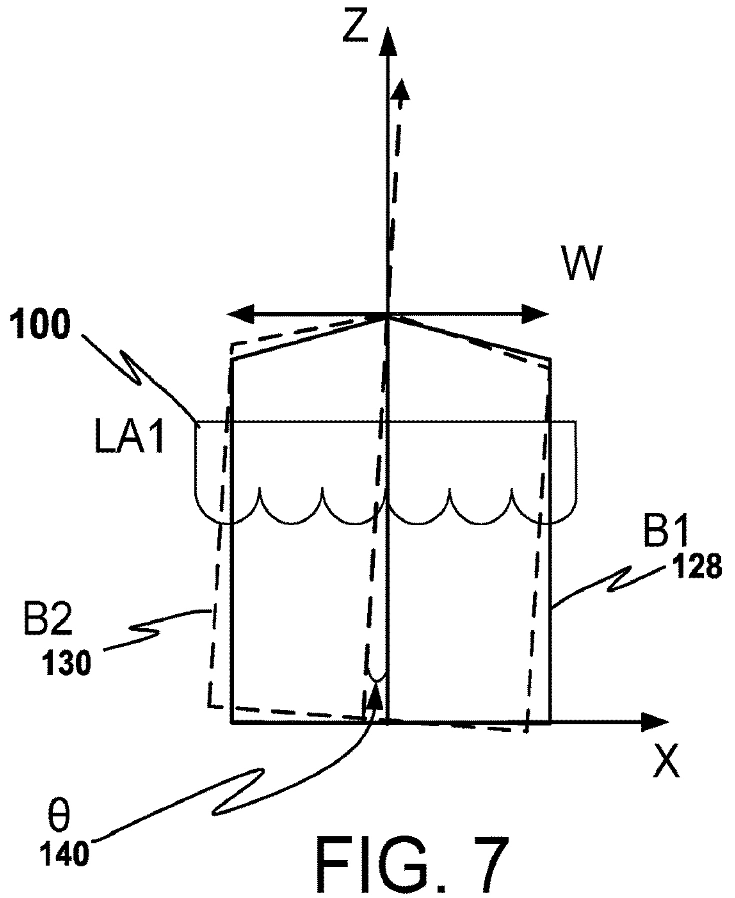
FIG. 7 provides a schematic diagram of orientation of two diodes in relation to another.

For example, B2 130 (parallel on the X-Z plane) is tilted by an angle θ 140 relative to B1 128 in Z direction, as shown in FIG. 7. Thus, the positions of these periodic peaks in the intensity are shifted by $f_{FL} \cdot \theta$.

Figure 9:
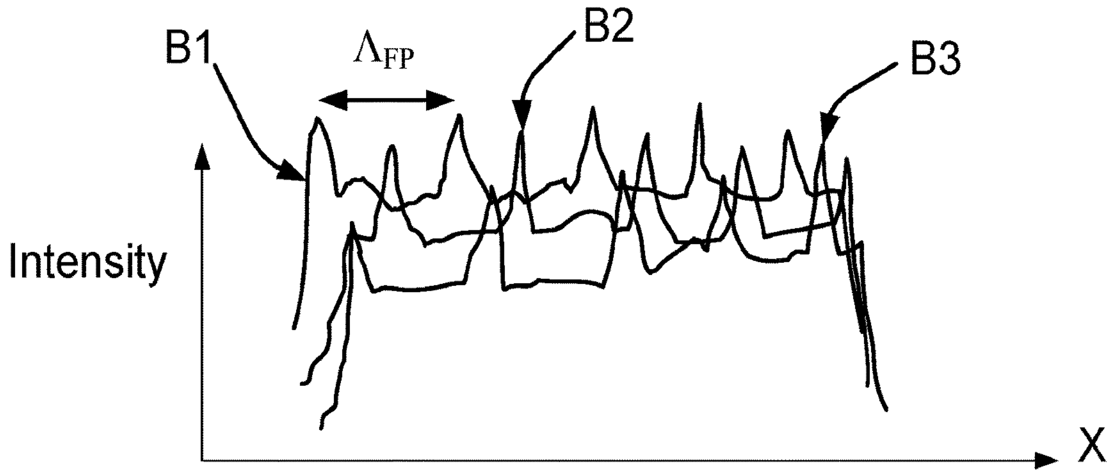
FIG. 9 provides a graph of intensity of three diodes.
Figure 10:
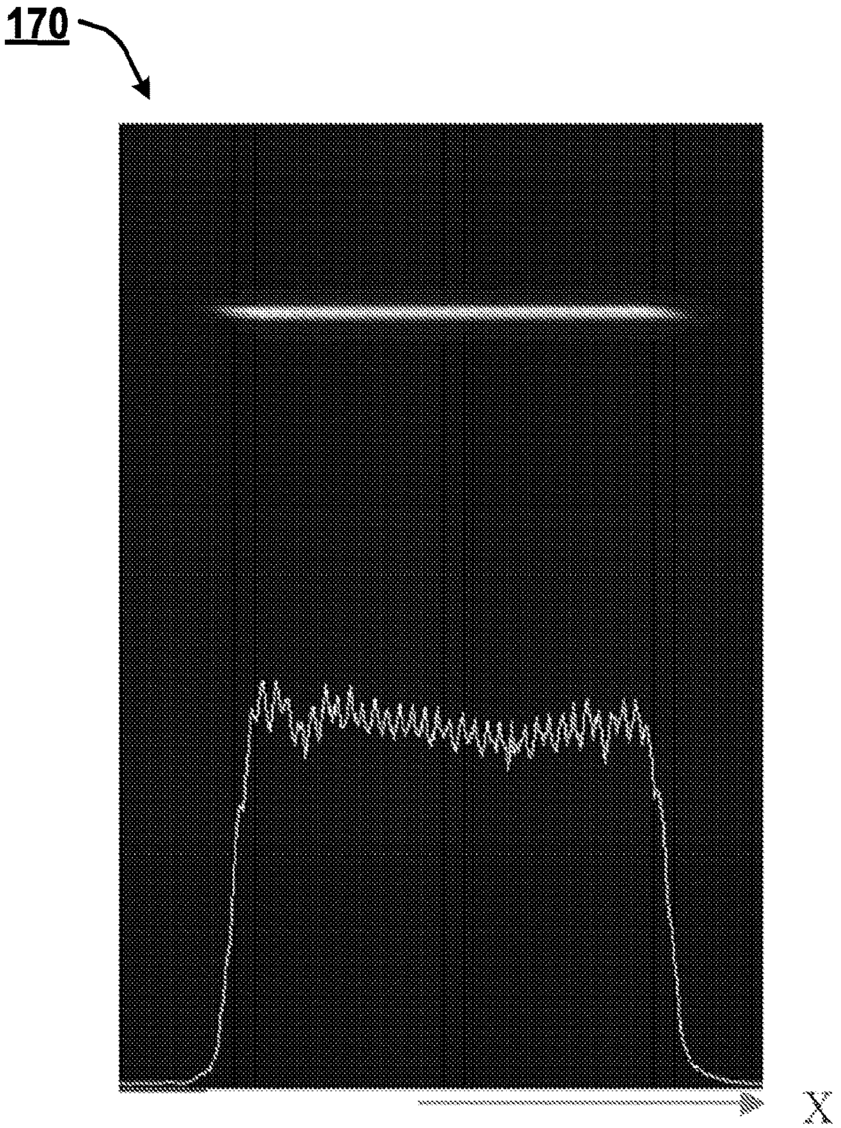
FIG. 10 illustrates a laser beam produced by two diodes at the imaging plane having a flattop intensity.

An example is provided in FIG. 8, where a 488 nm multimode diode laser B1 128 (see FIG. 7 inter alia) is homogenized by a pair of lens arrays 112, which are shown and described in FIG. 1B, FIG. 2, FIG. 3, FIG. 4 and FIG. 5. The flattop beam profile of FIG. 8, may be produced by forming a multimode diode laser 128 utilizing the focusing lens CL2 120 with $f_{FL}$ or f2 124 of 50 mm and $P_{LA}$ 150 of 0.5 mm that results in a $\Lambda_{FP}$ of ~50 μm. A second 488 nm multimode laser B2 130 (see FIG. 7 inter alia) is tilted relative to B1 by θ=0.5 mrad which shifts the peaks by 25 μm. By adding more multimode lasers with small tilting angle relative to each other, the periodic patterns are smoothed out as shown in FIG. 9 and FIG. 10. The result is a high power uniform flattop single line laser beam, or line image 170 produced at the imaging plane with small variation in intensity. As shown in FIG. 10, the intensity variation in the flattop is about 10% from using two diode lasers.

A high power uniform flattop single line laser beam may be useful for many bio applications that may demand a high throughput as the characteristics and properties of such a beam profile may allow more samples to be exposed to a uniform beam.

In one aspect, the high power uniform flattop single line laser beam described and disclosed herein may have the dimensions of approximately 0.5 mm to 10 cm in the X direction. Another aspect of such a beam may be that the size in the Y direction is diffraction limited. Additionally, the line may contain about 1 W to more than about a few hundred 100 W of power.

Figure 11:
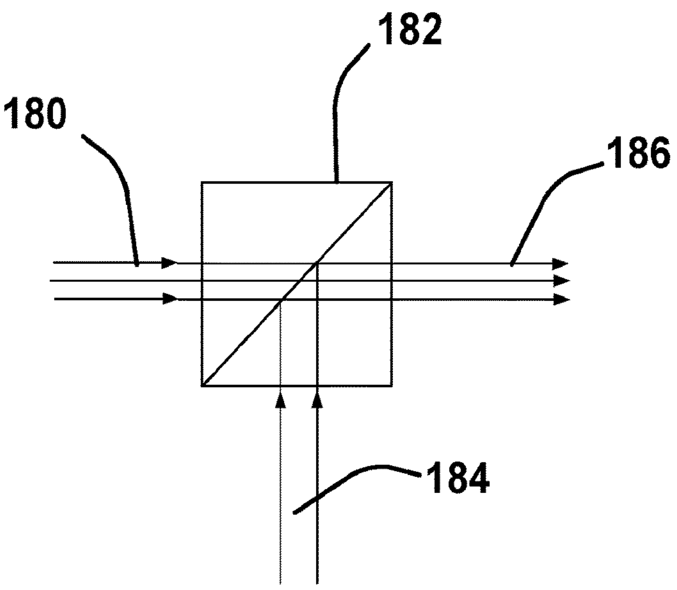
FIG. 11 shows one implementation of the present disclosure as a schematic diagram of how two similar laser diode beams may be polarization combined to double the total power.

Two similar laser diode beams can be polarization combined to double the total power of the laser line. An example of such a device or system is provided in FIG. 11. A p-wave 180 is directed at a polarization cube 182. Simultaneously, an s-wave 184 is directed at the polarization cube from an orthogonal direction. The resultant beam combines the polarity of the p-wave 180 and the s-wave 184 to form a combined output wave 186, that has increased power of the laser line.

Figure 12:
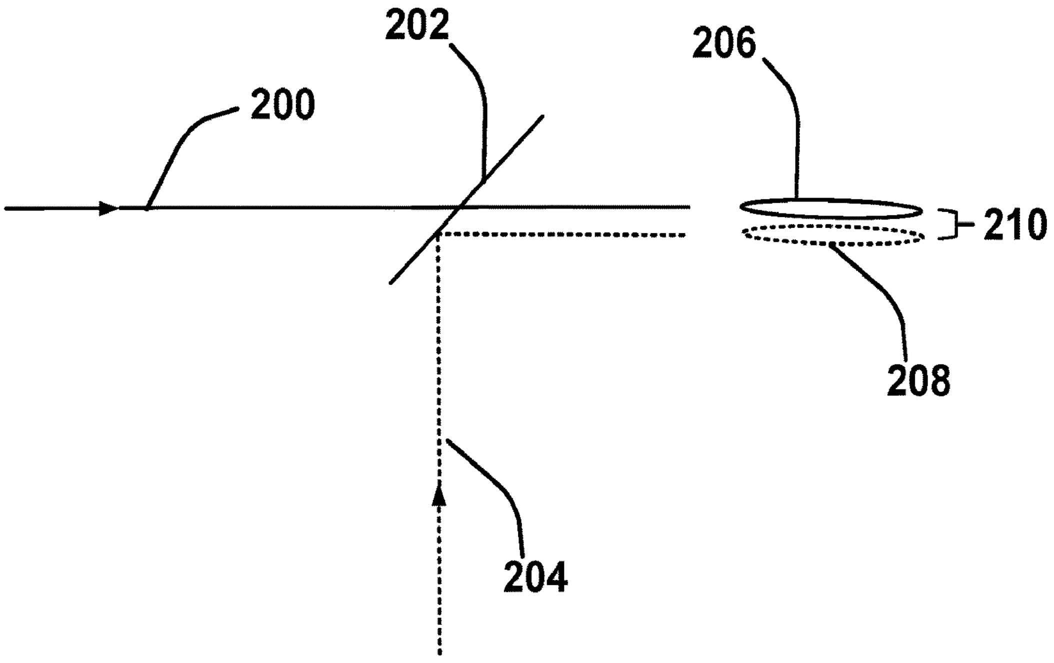
FIG. 12 illustrates the forming of two high power uniform lines using dichroic mirrors.

Two high power uniform flattop intensity laser beams of different wavelengths can be formed, propagated and spaced apart by using one or more dichroic mirrors. A schematic drawing of an exemplar device or system is shown in FIG. 12. A first high power uniform flattop beam 200 having a wavelength λ1 is transmitted towards a dichroic mirror 202. A second high power uniform flattop beam 204 having a wavelength λ2 is transmitted towards the dichroic mirror at angle of incidence, in this example approximately 45°. Dichroic mirrors are often designed to have 45°; however, other angles of incidence are possible. The dichroic mirror 202 is capable of transmitting the first beam 200 to create laser line 206 and reflecting the second beam 204 to create line 208. Incorporating one or several dichroic mirrors may allow the systems, devices, and methods hereof to be extended to generate more lines of different wavelengths by cascading more dichroic mirrors. The distance between the lines 210 may be zero, or any value, depending on the particular application.

In one aspect, the developments hereof include an arrangement of one or more multimode diode lasers, a pair of cylindrical lens arrays, together with one or more cylindrical lenses to produce a homogenized slow axis profile and near diffraction limited fast axis Gaussian profile in the desired plane. In the slow axis, diode lasers may be arranged as described and disclosed in FIG. 4, inter alia. This arrangement may be utilized to produce a uniform top hat or flat-top profile. In the fast axis, the diode lasers may be collimated and focused into a Gaussian profile. The output shape may have a relatively high aspect ratio of more than 5:1, in the orthogonal directions. This implementation may be polarization combined, using a polarization cube to double the total power of the optical scheme. Further, dichroic mirrors may be integrated with such an arrangement to form lines of uniform high power laser beams with different wavelengths at the image plane.

The above discussion is illustrative of the principles and various implementations of the present developments. Numerous variations, ramifications, and modifications of the basic concept which have not been described may become apparent to those skilled in the art once the above disclosure is fully appreciated. Therefore, the above description should not be taken as limiting the scope of the inventions, which is defined by the appended claims.

What is claimed is:

1. A device for generating a flat-top laser beam, the device comprising:

a light source;

a first cylindrical lens array, having a plurality of convex lenslets that face the light source;

a second cylindrical lens array, having a plurality of convex lenslets that face away from the light source;

the light source comprising two or more laser diodes; each of the two or more laser diodes having a respective beam, which are combined to yield a combined beam;

the two or more laser diodes being tilted relative to each other to shift respective intensity peaks of each respective beam and thus the combined beam has an improved uniformity of intensity of a flattop profile;

the first cylindrical lens array (LA1) having an effective first focal length (fLA1); and the second cylindrical lens array (LA2) having a second effective focal length (fLA2); the distance between the first cylindrical lens arrays (LA1) and the second cylindrical lens array (LA2) being greater than the second effective focal length (fLA2), but less than the combined first effective focal length (fLA1) plus the second effective focal length (fLA2);

tilting of the laser diodes producing periodic peaks of spacing $\Lambda_{FP}$ as defined by the equation:

$$\Lambda_{FP} = \frac{\lambda \cdot f_{FL}}{P_{LA}};$$

where $\lambda$ is the laser wavelength, $f_{FL}$ is the focal length of the second cylindrical lens array, and $P_{LA}$=pitch of lens array, the vertex clearance between two neighboring lenses of the array; and reducing the intensity variation by overlapping two or more diode lasers with an appropriate arrangement to shift the peaks of one diode laser to another diode laser; improving uniformity, the diode lasers being tilted relative to each other to shift the peaks of the intensity and achieve a smooth and improved uniformity of the intensity profile.

2. A device according to claim 1, the first and second cylindrical lens arrays being operably disposed for the first cylindrical lens array to receive light from the light source, the second cylindrical lens array to receive light from the first cylindrical lens array and thereby generate a light beam that has one or both a flat top intensity profile, or a flattop beam.

3. A device according to claim 1, the first and second cylindrical lens arrays defining a pair of cylindrical lens arrays.

4. A device according to claim 3, the pair of cylindrical lens arrays being operably disposed to homogenize a beam profile in a slow axis (X) of one or more diode lasers.

5. A device according to claim 4, having several collimated laser beams stacked in a y-direction in close proximity to increase power density.

6. A device according to claim 1, the first cylindrical lens array having a first focal length, the second cylindrical lens array having a second focal length, and the first cylindrical lens array and the second cylindrical lens array defining a distance therebetween that is greater than the second focal length of the second cylindrical lens array, but less than a sum of the first focal length of the first cylindrical lens array and the second focal length of the second cylindrical lens array.

7. A device according to claim 1, the first and second cylindrical lens arrays being operably disposed to receive a laser beam, the first and second cylindrical lens arrays collimating the laser beam.

8. A device according to claim 7, the collimating being in a fast axis (Y) by including and using either or both a fast axis collimation lens, or, a cylindrical lens.

9. A device according to claim 1, the light source comprising two or more laser diodes;

the laser diodes generating two similar laser diode beams that are polarization combined by including and using a polarization combining cube to double total power.

10. A device according to claim 1, including two or more dichroic mirrors, the dichroic mirrors forming at least two high power uniform lines of different wavelengths at some spacing.

11. A device of claim 1 further comprising either or both a fast axis collimation lens and a slow axis collimation lens.

12. A device of claim 1 further comprising one or both a slow axis collimation lens or a cylindrical lens.

13. A device of claim 1 further comprising one or more focusing lenses.

14. A device of claim 1 the light source being one or more diode lasers.

15. A device according to claim 1 further comprising a fast axis collimation lens having two or more half cylinder shaped convex lenses, or lenslets, that run an entire length of one side of the structure.

16. A device for generating a flat-top laser beam, the device comprising:

a light source;

a fast-axis collimating lens;

a slow-axis collimating lens;

a pair of cylindrical lens arrays; and, one or more focusing lenses to focus a beam on an image plane;

the light source comprising two or more laser diodes; each of the two or more laser diodes having a respective beam, which are combined to yield a combined beam;

the two or more laser diodes being tilted relative to each other to shift respective intensity peaks of each respective beam and thus the combined beam has an improved uniformity of intensity of a flattop profile;

tilting of the laser diodes producing periodic peaks of spacing $\Lambda_{FP}$ as defined by the equation:

$$\Lambda_{FP} = \frac{\lambda \cdot f_{FL}}{P_{LA}};$$

where $\lambda$ is the laser wavelength, $f_{FL}$ is the focal length of the second cylindrical lens array, and $P_{LA}$=pitch of lens array, the vertex clearance between two neighboring lenses of the array; and reducing the intensity variation by overlapping two or more diode lasers with an appropriate arrangement to shift the peaks of one diode laser to another diode laser; improving uniformity, the diode lasers being tilted relative to each other to shift the peaks of the intensity and achieve a smooth and improved uniformity of the intensity profile.

17. A device of claim 16, the pair of cylindrical lens arrays homogenizing a beam profile in a slow axis of the light source.

18. A device of claim 16, the one or more focusing lenses one or both combining or imaging beamlets received and overlapping the beamlets on an image plane.

19. A device according to claim 16, the pair of cylindrical lens arrays comprising a first lens array and a second lens array and the pair of cylindrical lens arrays further having a distance between the first lens array and second lens array that is greater than a focal length of the second lens array, but less than the sum of a focal length of the first lens array and the focal lengths of the second lens array.

* * * * *